(12) United States Patent
Saito (10) Patent No.: US 10,401,924 B2
(45) Date of Patent: Sep. 3, 2019

(54) LIQUID IMMERSION COOLING SYSTEM

(71) Applicant: ExaScaler Inc., Chiyoda-ku, Tokyo (JP)

(72) Inventor: Motoaki Saito, Tokyo (JP)

(73) Assignee: EXASCALER INC., Chiyoda-Ku, Tokyo (JP)

(*) Notice: Subject to any disclaimer, the term of this patent is extended or adjusted under 35 U.S.C. 154(b) by 67 days.

(21) Appl. No.: 15/741,094

(22) PCT Filed: Jul. 2, 2015

(86) PCT No.: PCT/JP2015/069205
§ 371 (c)(1),
(2) Date: Dec. 29, 2017

(87) PCT Pub. No.: WO2017/002270
PCT Pub. Date: Jan. 5, 2017

(65) Prior Publication Data
US 2018/0196484 A1    Jul. 12, 2018

(51) Int. Cl.
*F28D 1/06*    (2006.01)
*G06F 1/20*    (2006.01)
(Continued)

(52) U.S. Cl.
CPC ............... *G06F 1/20* (2013.01); *B66D 3/26* (2013.01); *H01L 23/44* (2013.01);
(Continued)

(58) Field of Classification Search
CPC ...... G06F 1/181; G06F 1/20; G06F 2200/201; H05K 7/20236; H05K 7/20272;
(Continued)

(56) References Cited

U.S. PATENT DOCUMENTS

2014/0218861 A1* 8/2014 Shelnutt ................ G06F 1/20
                                                                    361/679.53
2014/0301037 A1   10/2014 Best
(Continued)

FOREIGN PATENT DOCUMENTS

JP          11072591 A      3/1999
JP       2008025858 A       2/2008
(Continued)

OTHER PUBLICATIONS

ExaScaler Inc.,et al., "Liquid immersion cooling compact supercomputer "ExaScaler-1" succeeded in measurement of the value corresponding to the world highest level of the latest supercomputer power consumption performance ranking "Green500" resulting from the performance improvement by 25 % or higher", Mar. 31, 2015, [online] URL: http://exascaler.co.jp/wp-content/uploads/2015/03/20150331.pdf.
(Continued)

*Primary Examiner* — Davis D Hwu
(74) *Attorney, Agent, or Firm* — Procopio, Cory, Hargreaves & Savitch LLP (57) ABSTRACT

Inner partitions disposed within a cooling tank have an open space to form arrayed housing parts, and at least one unit of electronic device housed in each of the housing parts. A lifting mechanism includes a tower having a guide and a driving source for raising and lowering an arm, a slide mechanism attached to the cooling tank, and a stopper for restricting the tower's movement so that a range of the tower's motion in a width direction of the cooling tank does not exceed at least a width of the open space. The slide mechanism supports the tower movably with respect to the cooling tank in a horizontal plane located above the open space. The liquid immersion cooling system can safely lift or lower the electronic devices densely housed within the
(Continued)

cooling tank without requiring the stage in the periphery of the installation surface of the cooling tank.

14 Claims, 6 Drawing Sheets

(51) Int. Cl.
    *H01L 23/44*     (2006.01)
    *B66D 3/26*     (2006.01)
    *H05K 7/20*     (2006.01)

(52) U.S. Cl.
    CPC ..... *H05K 7/20236* (2013.01); *H05K 7/20272* (2013.01); *H05K 7/20781* (2013.01); *G06F 2200/201* (2013.01); *H05K 7/20763* (2013.01)

(58) Field of Classification Search
    CPC . H05K 7/20781; H05K 7/20763; F28F 27/02; B66D 3/26; H01L 23/44
    USPC .......................................................... 165/75
    See application file for complete search history.

(56) References Cited

U.S. PATENT DOCUMENTS

| | | | |
|---|---|---|---|
| 2014/0362527 A1 | 12/2014 | Best | |
| 2015/0060009 A1* | 3/2015 | Shelnutt | F28F 27/02 165/11.1 |
| 2017/0295676 A1* | 10/2017 | Conn | G06F 1/181 |

FOREIGN PATENT DOCUMENTS

| | | |
|---|---|---|
| JP | 2012527109 A | 11/2012 |
| JP | 2013187251 A | 9/2013 |
| KR | 101492559 B1 | 2/2015 |
| WO | 2014130891 A1 | 8/2014 |

OTHER PUBLICATIONS

International Search Report for related PCT application No. PCT/JP2015/069205 dated Aug. 4, 2015. English translation provided, 2 pages.
Extended European Search Report for related EP App No. 15899197.8 dated Jan. 31, 2019, 5 pgs.

* cited by examiner

FIG. 6

LIQUID IMMERSION COOLING SYSTEM

CROSS-REFERENCE TO RELATED APPLICATIONS

This application is a U.S. National Stage entry of PCT Application No. PCT/JP2015/069205, filed on Jul. 2, 2015, the contents of which are incorporated herein by reference.

TECHNICAL FIELD

The present invention relates to a liquid immersion cooling system for electronic device. More specifically, the present invention relates to the liquid immersion cooling system equipped with a lifting mechanism, containing cooling liquid flowing through the cooling tank for immersing and cooling the electronic device, for example, supercomputer or data center, which is configured to generate high heating value, and is required to exhibit superhigh performance and stable operation.

BACKGROUND ART

Conventionally, an air-cooling type and a liquid-cooling type have been in use for cooling supercomputers and data centers. The liquid-cooling type is generally recognized to be high in cooling efficiency because of using a liquid that is remarkably superior to air in heat transfer performance. For example, the liquid immersion cooling system using synthetic oil has been employed for the supercomputer called "TSUBAME-KFC" constructed by Tokyo Institute of Technology. However, because the synthetic oil being high in viscosity is used as the cooling liquid, it is difficult to completely remove, from electronic devices taken out from oil-immersed racks, the oil adhered thereto, and this gives rise to a problem that the maintenance (specifically, adjustment, inspection, repair, replacement and expansion, for example; the same applies hereafter) of the electronic devices is extremely difficult. Furthermore, the occurrence of a problem has also been reported that causes a difficulty to arise in practical use because the synthetic oil in use leaks by corroding a gasket and the like constituting the cooling system in a short period of time.

On the other hand, there has been proposed a liquid immersion cooling system that uses not the synthetic oil causing the aforementioned problems but a cooling liquid of fluorocarbon-base. Specifically, it is an example that uses a cooling liquid of the fluorocarbon-base (a hydrofluoroether (HFE) compound known as "Novec (trademark of 3M Company; the same applies hereafter) 7100", "Novec 7200" and "Novec 7300", brand names of 3M Company) (Patent Literature 1 and Patent Literature 2, for example).

The inventor has already developed the compact liquid immersion cooling system with excellent cooling efficiency that is suitable for storage of the supercomputer of small-scale liquid immersion cooling type. Such device has been applied to the compact super computer "Suiren" installed in the High-Energy Accelerator Research Organization (KEK) for operation (Non-Patent Literature 1).

CITATION LIST

Patent Literature

Patent Literature 1: Japanese Patent Application Laid-Open No. 2013-187251

Patent Literature 2: Japanese Unexamined Patent Application Publication (Translation of PCT Application) No. 2012-527109

Non-Patent Literature 1: "Liquid immersion cooling compact supercomputer "ExaScaler-1" succeeded in measurement of the value corresponding to the world highest level of the latest supercomputer power consumption performance ranking "Green500" resulting from the performance improvement by 25% or higher" Mar. 31, 2015, Press Release, ExaScaler Inc., et al., URL: http://exascaler.co.jp/wp-content/uploads/2015/03/20150331.pdf

SUMMARY OF INVENTION

Technical Problem

The liquid immersion cooling system requires a lifting mechanism for taking out the electronic device from the cooling tank such as the liquid immersion rack for conducting the maintenance work for the electronic device. Generally, a crane has been employed as the lifting mechanism.

Conventionally, the generally employed liquid immersion cooling system is required to provide a stage for mounting and operating the crane in the periphery of the installation surface of the cooling tank. It is therefore difficult to dispose a plurality of cooling tanks adjacently to one another. The floor area required for operating the supercomputer and the data center is increased as well as the installation area for all the cooling tanks, the stage area for the crane, and the passage area for the maintenance work. Occupation of a part of the passage area for the maintenance work by the stage area for the crane may impair safety of the maintenance work and deteriorate accessibility.

Direct installation of a lifting mechanism in the liquid immersion cooling system has been considered for space saving purpose. However, the liquid immersion cooling system developed by the inventor is configured to have the plurality of electronic devices highly densely housed. It is therefore necessary to develop a lifting mechanism adapted to lift and lower the electronic devices while preventing damage thereto.

The liquid immersion cooling systems may be adjacently arranged laterally in a row so as to further reduce the area of the floor required for constructing the large-scaled supercomputer and data center for the space saving purpose. In order to realize the dense arrangement of the liquid immersion cooling systems, it is necessary to develop a lifting mechanism configured to prevent interference between the operating ranges of the lifting mechanisms of the adjacent liquid immersion cooling systems.

It is an object of the present invention to provide a liquid immersion cooling system with a lifting mechanism without requiring the stage in the periphery of the installation surface of the cooling tank for solving the disadvantages of the foregoing prior art.

It is another object of the present invention to provide a liquid immersion cooling system with a lifting mechanism capable of lifting or lowering highly densely housed electronic devices in the cooling tank.

It is still another object of the present invention to provide a liquid immersion cooling system with a lifting mechanism, configured to prevent interference between the operating ranges of the lifting mechanisms of the adjacent liquid immersion cooling systems in the case of highly densely arranged liquid immersion cooling systems.

Solution to Problem

According to an aspect of the present invention, provided is a liquid immersion cooling system configured to immerse a plurality of electronic devices in a cooling liquid for direct cooling. The liquid immersion cooling system includes a cooling tank having an open space defined by a bottom wall and side walls, a plurality of arrayed housing parts formed by dividing the open space of the cooling tank with a plurality of inner partitions therein, each of the arrayed housing parts being configured to house at least one unit of the electronic device, and a lifting mechanism having an arm configured to lift at least the one unit of the electronic device from the housing part, and to lower the electronic device into the housing part. The lifting mechanism of the liquid immersion cooling system includes a tower having a guide and a driving source for raising and lowering the arm, a slide mechanism attached to the cooling tank for movably supporting the tower with respect to the cooling tank in a horizontal plane located above the open space, and a stopper for restricting a movement of the tower so that a range where the tower moves in a width direction of the cooling tank does not substantially exceed at least a width of the open space.

In the liquid immersion cooling system according to the preferred embodiment of the present invention, the slide mechanism may include a pair of longitudinal rails attached to top ends of a pair of side walls disposed in the width direction of the cooling tank, a movable bases movably supported on the pair of longitudinal rails, and a pair of lateral rails disposed on the movable bases. The tower may be movably supported on the pair of lateral rails.

In the liquid immersion cooling system according to the preferred embodiment of the present invention, the lifting mechanism may further include a controller for controlling operations to raise and lower the arm, and to bring the arm into a stationary state at an arbitrary height in a vertical direction of the tower.

In the liquid immersion cooling system according to the preferred embodiment of the present invention, the pair of longitudinal rails may have running ranges where the movable bases are located rearward apart from above the open space of the cooling tank.

In the liquid immersion cooling system according to the preferred embodiment of the present invention, the cooling tank may include a top board for closing the open space. The pair of longitudinal rails may be located outside a width of the top board when the top board is disposed on an opening of the cooling tank.

In the liquid immersion cooling system according to the preferred embodiment of the present invention, the cooling tank may include an inflow opening and an outflow opening for the cooling liquid. The inflow opening may be formed in a bottom part or a side surface of each of the housing parts, and the outflow opening may be formed in the vicinity of the liquid level of the cooling liquid.

In the liquid immersion cooling system according to the preferred embodiment of the present invention, the cooling tank may include an inflow opening and an outflow opening for the cooling liquid. At least one of the inner partitions may include a plurality of inflow pipes or a plurality of outflow pipes extending to a position in the vicinity of the liquid level of the cooling liquid while penetrating the bottom wall, and a plurality of board retainers for holding edges of boards of the respective electronic devices. Each of the inflow pipes may include a plurality of small holes in a longitudinal direction of the inflow pipe as the inflow openings. Each of the outflow pipes may include a plurality of small holes in a longitudinal direction of the outflow pipe as the outflow openings. At least one outflow opening is formed in the vicinity of the liquid level of the cooling liquid.

According to another aspect of the present invention, provided is a liquid immersion cooling system configured to immerse a plurality of electronic devices in a cooling liquid for direct cooling. The liquid immersion cooling system includes a plurality of cooling tanks adjacently arranged in a lateral direction, the cooling tank having an open space defined by a bottom wall and side walls, a plurality of arrayed housing parts formed by dividing the open space of the cooling tank with a plurality of inner partitions therein, each of the arrayed housing parts being configured to house at least one unit of the electronic device, and at least one lifting mechanism having an arm configured to raise at least the one unit of the electronic device from the housing part, and lower the electronic device into the housing part. The at least one lifting mechanism may include a tower having a guide and a driving source for raising and lowering the arm, a slide mechanism attached to the adjacent cooling tanks for movably supporting the tower with respect to the adjacent cooling tanks in a horizontal plane located above the open space, and a stopper for restricting a movement of the tower so that a range where the tower moves in a width direction of the adjacent cooling tanks does not substantially exceed a distance between the farthest separated side walls in the lateral direction among those for forming the open spaces of the adjacent cooling tanks.

Advantageous Effects of Invention

The liquid immersion cooling system according to the present invention is configured to provide a plurality of inner partitions inside the cooling tank having an open space defined by the bottom wall and the side walls so as to divide the open space into a plurality of arrayed housing parts. The vertically long electronic devices each having the width smaller than the longitudinal length or the lateral width of the open space of the cooling tank (for example, the width approximately ½, ⅓, ¼ of those of conventional electronic devices) are highly densely housed in the respective housing parts. Those electronic devices are cooled with the cooling liquid flowing through the housing parts.

The liquid immersion cooling system according to the present invention employs the lifting mechanism equipped with the arm for lifting the vertically long electronic device from the housing part, and lowering the electronic device into the housing part. Specifically, the lifting mechanism includes a tower having a guide and a driving source for raising and lowering the arm, a slide mechanism which is attached to the cooling tank, and configured to movably support the tower at the cooling tank in a horizontal plane located above the open space, and a stopper which restricts the movement of the tower so that its movable range in the width direction of the cooling tank does not substantially exceed at least the width of the open space. The thus structured liquid immersion cooling system according to the present invention is capable of safely lifting or lowering the electronic devices highly densely housed in the cooling tank without requiring the stage in the periphery of the installation surface of the cooling tank. Additionally, it is possible to prevent interference between the operation ranges of the lifting mechanisms of the adjacent liquid immersion cooling systems.

Incidentally, the cooling tank having the "open space" in the present description is to be construed also to encompass a cooling tank having a simple sealed structure of the degree that does not spoil the maintainability of the electronic device. For example, a structure in which the top board is attached through a gasket and the like to be detachable or to be openable and closable can be regarded as the simple sealed structure.

The foregoing object and advantages and other objects and advantages of the present invention will be further clarified by the description of the following embodiments. However, the embodiments described hereafter are for exemplification purpose and do not intend to limit the present invention to the embodiments.

DESCRIPTION OF EMBODIMENT

A preferred embodiment of the liquid immersion cooling system according to the present invention will be described in detail referring to the drawings. In the description, a plurality of processor boards each having a processor formed of a CPU or a GPU installed therein are disposed on both surfaces of the board to constitute an electronic device (1 unit). An explanation will be made with respect to the high density liquid immersion cooling system configured to house 16 units of the electronic device in the divided housing parts of the cooling tank so as to be cooled. Incidentally, these are for the purpose of exemplifications. The number of units of the electronic device housed in the highly densified liquid immersion cooling system is discretionary. They do not limit in anyway the configuration of the electronic device to which the present invention is applied.

Referring to FIG. 1 to FIG. 6, a liquid immersion cooling system 1 according to an embodiment of the present invention includes a cooling tank 10. An open space 10a is defined by a bottom wall 11 and side walls 12 of the cooling tank 10. Inner partitions 13a, 13b, 13c, 13d, 13e are laterally disposed in the cooling tank 10 so as to equally divide the open space 10a into four arrayed housing parts 14a, 14b, 14c, 14d. In the embodiment, four units of a vertically long electronic device 100 having the width ¼ of the longitudinal length of the open space 10a of the cooling tank 10 are housed in each of the housing parts 14a, 14b, 14c, 14d. That is, 16 units may be highly densely housed in the cooling tank.

A casing 12a is provided around the outer periphery of the side walls 12 of the cooling tank 10. The space is formed between the side wall 12 at the front side of the cooling tank 10 and the casing 12a. A top board 10b for closing the open space 10a of the cooling tank 10 may be housed in the space. Upon the maintenance work for the liquid immersion cooling system 1, the top board 10b is kept housed in the space.

Upon operation of the liquid immersion cooling system 1, the top board 10b is taken out from the space to cover the opening of the cooling tank 10 so that the open space 10a is closed.

The cooling tank 10 is filled with the cooling liquid (not shown) up to the liquid level (not shown) sufficient to immerse the entire body of the electronic device 100. As the cooling liquid, there can preferably be used a fluorine-based inert liquid comprising perfluoride (a perfluorocarbon compound) and known as "Fluorinert (trademark of 3M Company; the same applies hereafter) FC-72" (boiling point: 56° C.), "Fluorinert FC-770" (boiling point: 95° C.), "Fluorinert FC-3283" (boiling point: 128° C.), "Fluorinert FC-40" (boiling point: 155° C.) or "Fluorinert FC-43" (boiling point: 174° C.), the brand names of 3M Company. However, the cooling liquid is not limited to any of these. The use of Fluorinert FC-40 or FC-43, each having the boiling point higher than 150° C. and being extremely hard to vaporize, is advantageous for keeping the liquid level height in the cooling tank 10 for a long period of time.

Disposed below the bottom wall 11 of the cooling tank 10 are a plurality of inflow headers 16 each having inlets 15 for the cooling liquid at both ends, and a plurality of outflow headers 17 each having outlets 18 for the cooling liquid at both ends. Those inflow headers 16 and the outflow headers 17 are alternately arranged in the lateral direction with respect to the bottom wall 11 of the cooling tank 10.

Each of the inner partitions 13a, 13b, 13c, 13d, 13e includes a plurality of inflow pipes 160, and a plurality of outflow pipes 170 both penetrating through the bottom wall 11 via bottom openings 150, and extending to the vicinity of the liquid level of the cooling liquid, and a plurality of board retainers 130 for retaining an edge of a board 120 of the electronic device 100. In the embodiment, the inflow pipes 160 and the outflow pipes 170 are alternately disposed via spacers 140 at left and right sides of the board retainers 130 each having one end fixed to the bottom wall 11. In each of the housing parts 14a, 14b, 14c, 14d, a recess part formed by a pair of board retainers 130 longitudinally facing with each other in the cooling tank 10 is designed to mechanically hold the edge of the board 120 of the electronic device 100 at both sides. For the mechanical holding operation, it is possible to attach a rod-like support to the edge of the board 120 so as to be fit with the width of the recess part defined by the board retainers 130.

Each of the inflow pipe 160 and the outflow pipe 170 has a rectangular cross section, for example. The inflow pipe 160 has a plurality of small holes as inflow openings 116 along the longitudinal direction of the inflow pipe 160. Likewise, the outflow pipe 170 has a plurality of small holes as outflow openings 117 along the longitudinal direction of the outflow pipe 170. The inflow openings 116 are formed in front and back surfaces of the inflow pipe 160. Likewise, the outflow openings 117 are formed in front and back surfaces of the outflow pipe 170.

Additionally, a plurality of small holes penetrating through the bottom wall 11 are formed in bottom parts of the housing parts 14a, 14b, 14c, 14d as another inflow openings 116 and another outflow openings 117, respectively. Another outflow opening 127 is formed in the upper portion of the side wall 12 at the back side of the cooling tank 10. The outflow opening 127 formed in the side wall 12 at the back side corresponds to the outflow opening formed in the vicinity of the liquid level of the cooling liquid.

In the embodiment, the flow of the cooling liquid upon the use of the liquid immersion cooling system 1 will be described. The cooled cooling liquid which has been supplied from the inlets 15 at both sides to the inflow headers 16 is partially discharged from the inflow openings 116 formed in the respective bottom parts of the housing parts 14a, 14b, 14c, 14d. The remaining cooling liquid is supplied into the inflow pipes 160 through the bottom openings 150. The cooling liquid supplied into the inflow pipes 160 is discharged from the inflow openings 116 formed in the inflow pipes 160.

The cooling liquid warmed by heat taken from the electronic devices 100 housed in the housing parts 14a, 14b, 14c, 14d passes through the outflow opening 127 formed in the side wall 12 at the back side of the cooling tank 10 in the vicinity of the liquid level, and flows out of the cooling tank 10. The warmed cooling liquid is partially drawn into the outflow headers 17 from the outflow openings 117 formed in the bottom parts of the housing parts 14a, 14b, 14c, 14d. At the same time, the cooling liquid passes through the outflow openings 117 formed in the outflow pipe 170, and the bottom openings 150 so as to be drawn into the outflow headers 17. The cooling liquid drawn into the outflow headers 17 flows out of the cooling tank 10 while passing through the outlets 18.

The inflow openings 116 for the cooling liquid are formed in the bottom parts or the side surfaces of the respective housing parts 14a, 14b, 14c, 14d, and the outflow opening 127 is formed in the vicinity of the liquid level of the cooling liquid. The above-described structure prevents retention of the cooling liquid which has been warmed by the highly densely housed electronic devices 100 in the respective housing parts 14a, 14b, 14c, 14d so that the cooling efficiency is improved. The structure having the inflow pipe 160 with the inflow openings 116 and the outflow pipe 170 with the outflow openings 117 disposed at the left and right sides of each of the board retainers 130 is especially advantageous because of further enhanced effect for preventing retention of the cooling liquid.

Referring to the drawing, the detailed explanation will be made with respect to the lifting mechanism configured to lift and lower the vertically long electronic devices 100 which are highly densely housed in the cooling tank 10 from/into the housing parts 14a, 14b, 14c, 14d, respectively.

A lifting mechanism 20 includes an arm 22 configured to lift the electronic devices 100 from the housing parts 14a, 14b, 14c, 14d, and lower them into the housing parts 14a, 14b, 14c, 14d. The lifting mechanism 20 includes a tower 21 equipped with a guide 218 and a driving source 213 for raising and lowering the arm 22, and a slide mechanism 23 attached to the cooling tank 10 for movably supporting the tower 21 with respect to the cooling tank 10 in a horizontal plane located above the open space 10a. As the slide mechanism 23 is directly attached to the cooling tank 10, the stage does not have to be provided in the periphery of the installation surface of the cooling tank 10. The guide 218 and the driving source 213 of the tower 21 allow the arm 22 to move up and down. This makes it possible to safely lift or lower the electronic devices highly densely housed in the cooling tank without vibrating the arm forward, backward, leftward, and rightward during the lifting/lowering operation.

Figure 1:
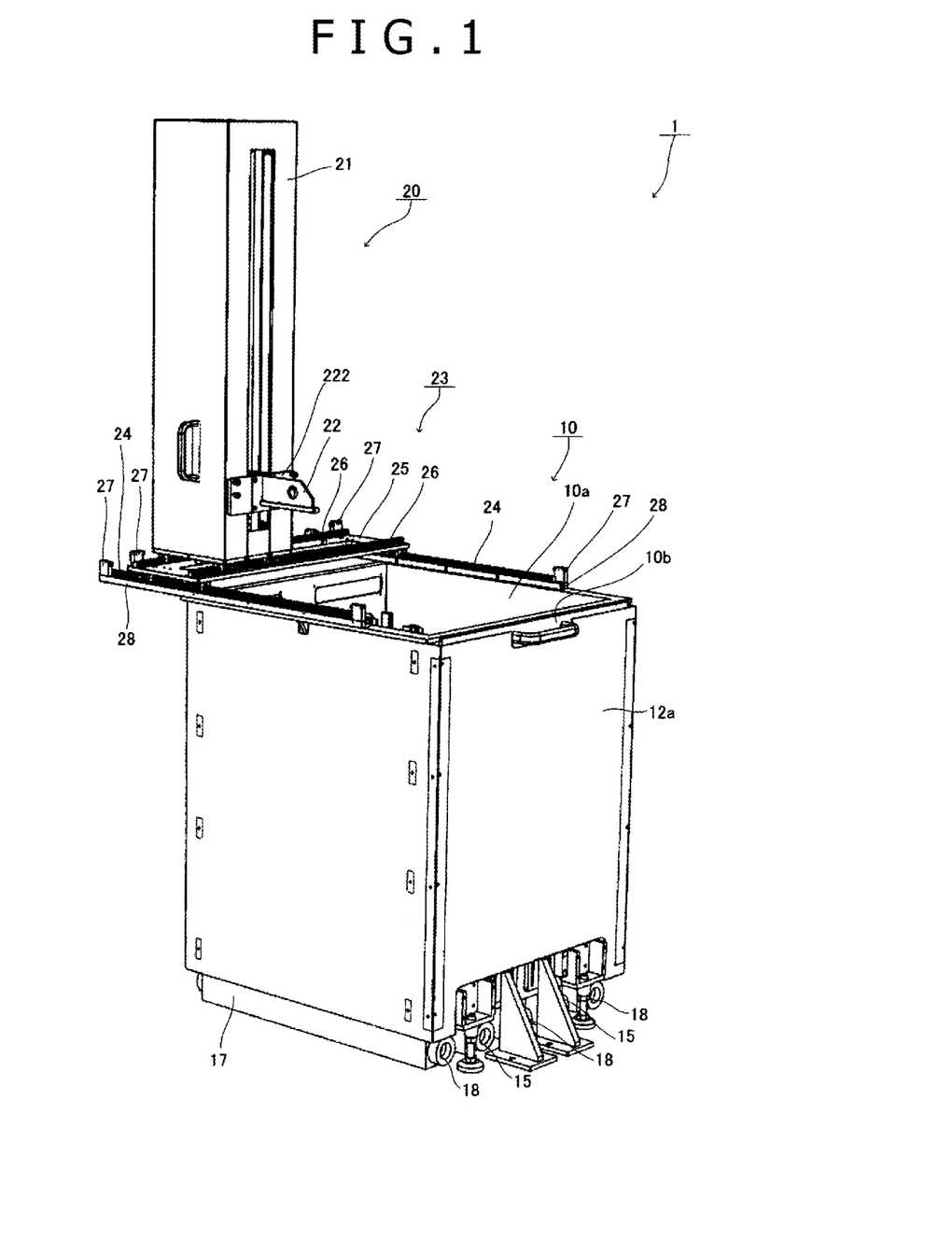
FIG. 1 is a perspective view of an overall structure of a liquid immersion cooling system according to an embodiment of the present invention.
Figure 2:
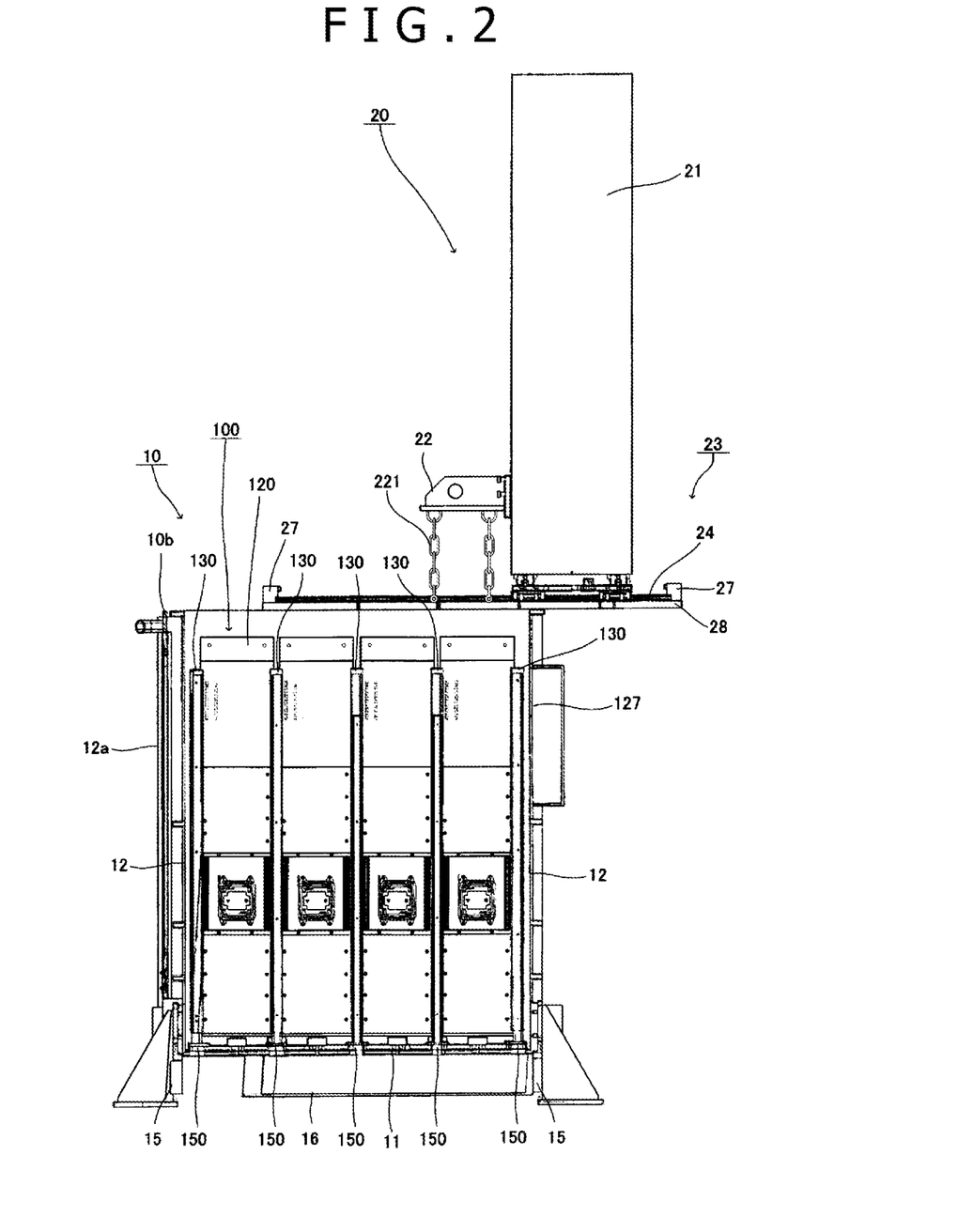
FIG. 2 is a longitudinal sectional view of the liquid immersion cooling system according to the embodiment of the present invention.
Figure 3:
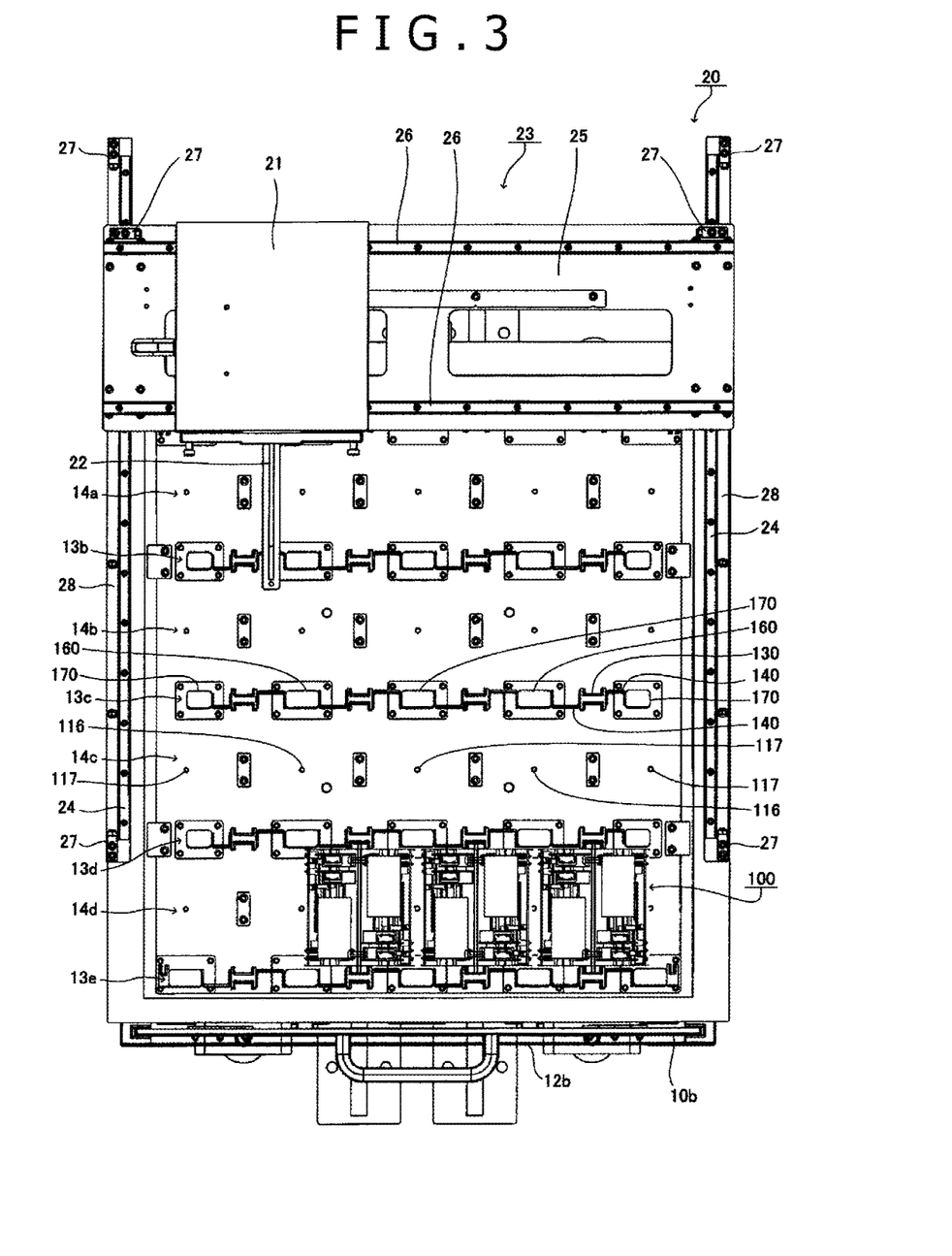
FIG. 3 is a plan view of the liquid immersion cooling system according to the embodiment of the present invention.
Figure 4:
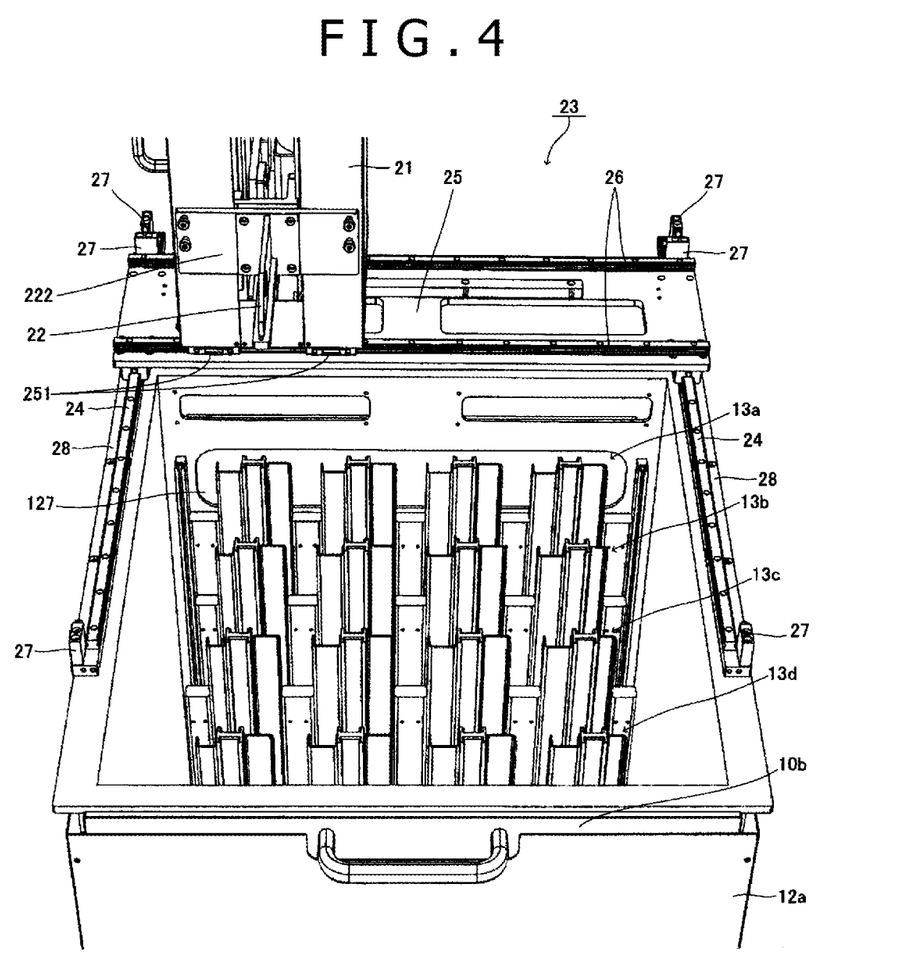
FIG. 4 is a perspective view of a structure of an essential part of the liquid immersion cooling system according to the embodiment of the present invention.
Figure 5:
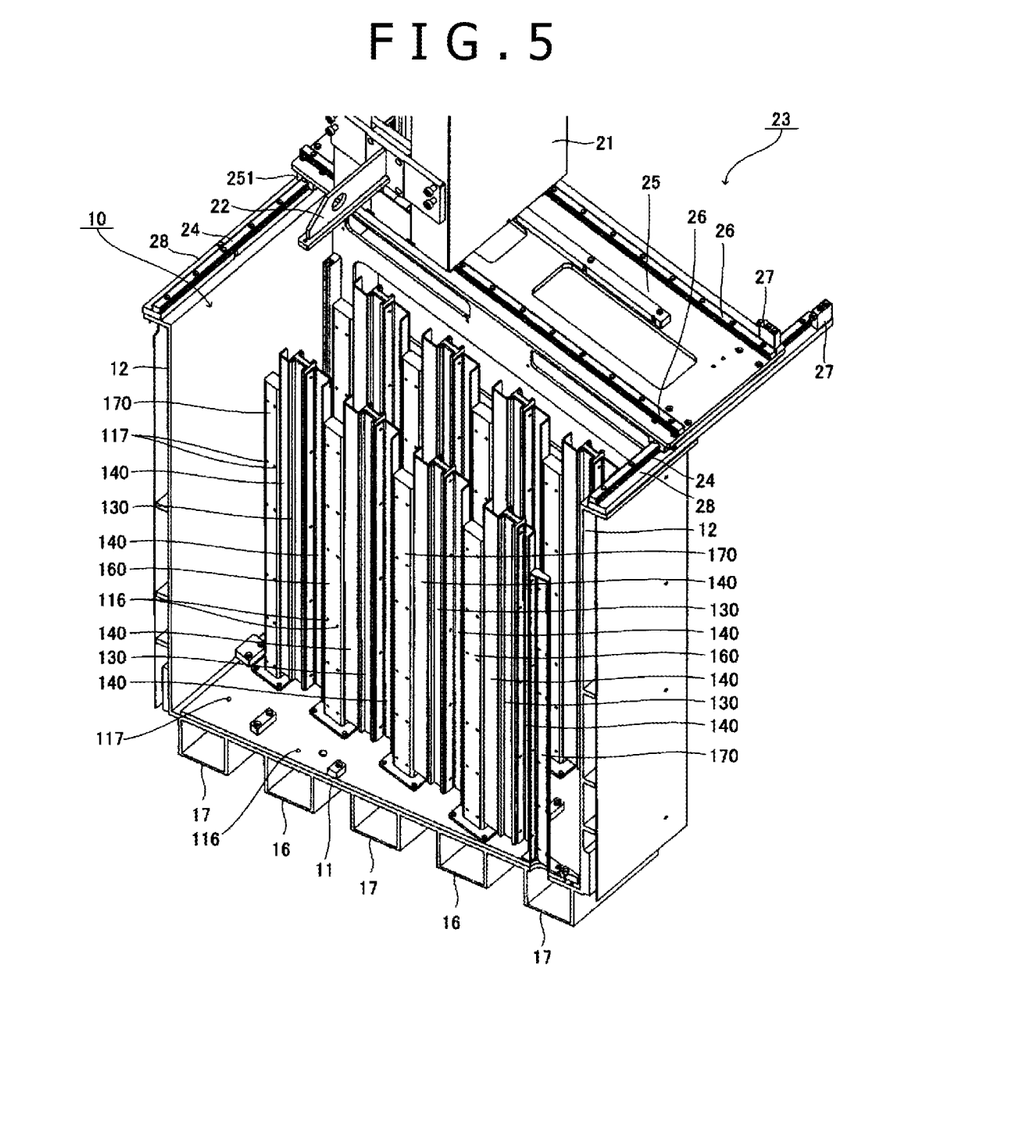
FIG. 5 is a lateral sectional view of a structure of the essential part of the liquid immersion cooling system according to the embodiment of the present invention.
Figure 6:
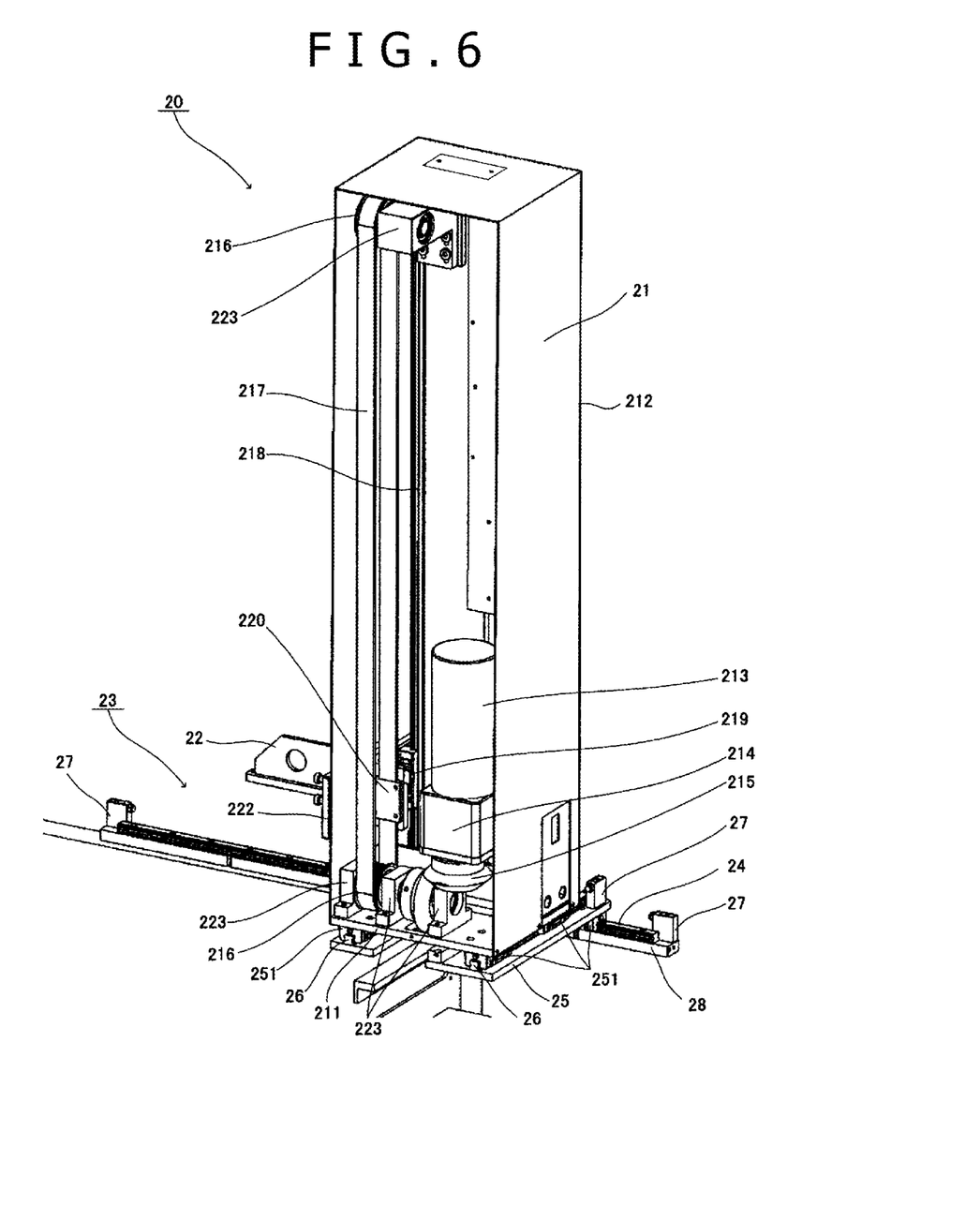
FIG. 6 is a longitudinal sectional view of an example of a lifting mechanism of the liquid immersion cooling system according to the embodiment of the present invention.

In the embodiment, the tower 21 includes a reducer 214 for reducing the rotating speed of the shaft of the driving source 213 such as a servo motor, a gear 215 for converting the rotation of the shaft of the reducer 214 into the rotation of the shaft orthogonal to the shaft of the reducer 214, a pair of timing pulleys 216, and a timing belt 217. One of brackets 222 of the arm 22 is movably supported at the guide 218 disposed in the vertical direction (Z direction). The other bracket 222 of the arm 22 is fixed to the timing belt 217 through a belt holder 220. The shaft of the gear 215 and the shaft of the timing pulley 216 are rotatably supported with bearing holders 223.

In the embodiment, the slide mechanism 23 includes a pair of longitudinal rails 24 disposed on the top ends of the pair of side walls 12 positioned in the width direction of the cooling tank 10, a movable bases 25 movably supported on the pair of longitudinal rails 24, and a pair of lateral rails 26 disposed on the movable bases 25. The tower 21 is movably supported on the pair of lateral rails 26. Specifically, a plurality of guide rollers 251 attached to the lower parts of the movable bases 25 slide on the pair of longitudinal rails 24 so as to allow the longitudinal movement of the tower 21 (Y direction). The guide rollers 251 attached to a fixation base 211 at the bottom part of the tower 21 slide on the pair of lateral rails 26 to allow the lateral (X direction) movement of the tower 21.

Referring to the example shown in the drawing, a pair of supports 28 are used for placing the pair of longitudinal rails 24 on the top ends of the side walls 12 of the cooling tank 10. The support 28 is fixed to the top end of the side wall 12 so that one end of the support 28 projects rearward from the cooling tank 10 by the length substantially equal to the longitudinal length of the tower 21. The pair of longitudinal rails 24 are disposed on the thus projected pair of supports 28. Then the pair of longitudinal rails 24 have running ranges where the movable bases 25 are located at the position to the rear of the upper part of the open space 10a of the cooling tank 10 for allowing the electronic device 100 to be lifted from the housing part 14a that is the nearest to the side wall 12 at the back side of the cooling tank 10, and to be lowered into the housing part 14a. The pair of supports 28 and the pair of longitudinal rails 24 are disposed so as to be located outside the width of the top board 10b when it is disposed to cover the opening of the cooling tank 10. The above-described structure is designed so that those supports 28 and the longitudinal rails 24 do not prevent the top board 10b from closing the open space 10a.

Stoppers 27 disposed in the vicinity of both ends of the pair of longitudinal rails 24 serve to restrict the range in which the tower 21 moves in the longitudinal direction (Y direction) of the cooling tank 10 in a horizontal plane located above the open space 10a. The stoppers 27 disposed in the vicinity of both ends of the pair of lateral rails 26 serve to restrict the movement of the tower 21 so that the range in which the tower 21 moves in the width direction (X direction) of the cooling tank 10 does not substantially exceed at least the width of the open space 10a. This secures to prevent the fixation base 211 or a housing 212 of the tower 21 from exceeding over the width of the cooling tank 10 upon movement of the tower 21 in the width direction of the cooling tank 10. Although the plurality of liquid immersion cooling systems are densely arranged, the above-described structure may prevent the interference between operation ranges of the lifting mechanisms of the adjacent liquid immersion cooling systems.

The operation of the above-structured lifting mechanism 20 will be described. The tower 21 is horizontally moved with a handgrip at the side of the tower 21 grabbed, and stopped at the position where the arm 22 is located just above the board 120 of the electronic device 100 to be lifted. A controller (not shown) is operated to drive the driving source 213 of the tower 21 so that the rotation of the shaft of the driving source 213 is transferred to the timing pulley 216 via the gear 215 to lower the arm 22 to the lowermost part. In this state, tips of a pair of suspension fittings 221 attached to the lower part of the arm 22 are connected to a pair of holes formed in the top end of the board 120 of the electronic device 100. Then the controller (not shown) is operated to transfer the reverse rotation of the shaft of the driving source 213 of the tower 21 to the timing pulley 216 for lifting the arm 22. The electronic device 100 which is suspended with the arm 22 by the suspension fittings 221 is then lifted while having the board 120 sliding in the board retainer 130. Upon raising of the arm 22 to the uppermost part, the electronic device 100 is brought into suspended state while being completely taken out from the board retainer 130 of the housing parts 14a, 14b, 14c, 14d. In the above-described state, the tower 21 may be horizontally moved to conduct the maintenance work for the electronic device 100 as needed. After finishing the maintenance work, the controller (not shown) is operated again to lower the electronic device 100 into the housing parts 14a, 14b, 14c, 14d so as to be returned to the original position.

Meanwhile, the controller (not shown) is operated to stop driving the driving source 213 of the tower 21 during the operation for lifting or lowering the arm 22 so that the arm 22 is made stationary at the arbitrary height in the vertical direction of the tower 21. The electronic device 100 is suspended at the desired height while being held partially in the board retainer 130 of the housing parts 14a, 14b, 14c, 14d without being completely taken out therefrom. In the above-described state, it is possible to conduct the maintenance work for the electronic device 100. In the state where the electronic device 100 is suspended as well as in the stationary state at the arbitrary height in the direction vertical to the tower 21, the reducer 214 helps in preventing the downward load applied to the arm 22 from causing unintentional rotation of the shafts of the timing pulley 216 and the driving source 213.

In the above embodiment, the use of the single cooling tank has been explained as an example. However, it is possible to employ a plurality of adjacently arranged cooling tanks in the lateral direction. In this case, at least one lifting mechanism may be shared by the adjacently disposed cooling tanks. Specifically, the at least one lifting mechanism may be configured to include a tower having a guide and a driving source for raising and lowering an arm, a slide mechanism which is attached to the adjacent cooling tanks for movably supporting the tower to the adjacent cooling tanks in a horizontal plane located above the open spaces, and stoppers for restricting movement of the tower so that the tower movement range in the width direction of the adjacent cooling tanks does not substantially exceed the distance between the farthest separated side walls in the lateral direction among those for forming the open spaces of the adjacent cooling tanks.

In the case of the plurality of cooling tanks adjacently arranged in the lateral direction, preferably, the slide mechanism includes a pair of longitudinal rails disposed on the top ends of a pair of side walls located in the width direction of the respective cooling tanks, a movable bases supported movably on the pair of longitudinal rails, and a pair of lateral rails disposed on the movable bases. Preferably, a tower is movably supported on the pair of lateral rails. The width of the movable base may be substantially the same as that of the cooling tank, or the same as the whole width of the adjacently arranged cooling tanks. If the movable base has the width substantially the same as that of the single cooling tank, the pair of lateral rails for one of the adjacent cooling tanks may be linked to the pair of lateral rails for the other cooling tank using an appropriate linkage member. This makes it possible to move the tower on the pair of lateral rails for one of the adjacent cooling tanks onto the pair of lateral rails for the other cooling tank so that the single tower is shared by the adjacently arranged cooling tanks. If the movable base has the width substantially the same as the whole width of the adjacently arranged cooling tanks, the length of the lateral rails may be set to the whole width of the adjacently arranged cooling tanks. Therefore, the linkage member for linking the pair of lateral rails is not required.

In the above embodiment, manual movement of the tower 21 in the horizontal plane has been explained as an example. It is possible to add a driving source for running the movable base 25 on the longitudinal rail 24, and another driving source for running the tower 21 including the fixation base 211 on the lateral rail 26 to the lifting mechanism so as to move the tower 21 by operation of the controller (not shown). It is possible to employ electric driving sources such as servo motors for those additional driving sources.

In the case of movement of the tower 21 in the horizontal plane by adding the electric driving sources, it is preferable to replace the mechanical stoppers 27 as shown in the drawing for physically preventing movement of the tower 21 with the movement restriction mechanism through software. In the specification, the stopper may include both the mechanical stopper and the movement restriction mechanism through software.

In the above embodiment, the explanation has been made with respect to the processor boards arranged on both surfaces of the board 120 to constitute the electronic device 100 as an example. The processor may be configured to include CPU and/or GPU. The electronic device 100 may include a high-speed memory, a chipset, a network unit, a PCI Express bus, a bus switch unit, an SSD, and a power unit (AC-DC converter, DC-DC voltage converter). The electronic device 100 may be the one like a server including a blade server, a router, or a storage device such as SSD. As described above, the vertically long electronic device with the width smaller than the usual width of the conventional electronic device (for example, approximately ½, ⅓, ¼ of the width) is available.

The liquid immersion cooling system according to the present invention is capable of safely lifting or lowering the electronic devices which are highly densely housed in the cooling tank without requiring the stage in the periphery of the installation surface of the cooling tank. Additionally, even if a plurality of liquid immersion cooling systems are densely arranged, it is possible to prevent the interference between the operation ranges of the lifting mechanisms of the adjacent liquid immersion cooling systems.

INDUSTRIAL APPLICABILITY

The present invention is applicable to a wide variety of liquid immersion cooling systems configured to immerse the electronic device in the cooling liquid so as to be efficiently cooled.

REFERENCE SIGNS LIST

1: liquid immersion cooling system,
10: cooling tank,
10a: open space,
10b: top board,
11: bottom wall,
12: side wall,
12a: casing,
100: electronic device,
120: board, 130: board retainer,
140: spacer,
13a, 13b, 13c, 13d, 13e: inner partition,
14a, 14b, 14c, 14d: housing part,
15: inlet,
150: bottom opening,
16: inflow header,
116: inflow opening,
160: inflow pipe,
17: outflow header,
117,127: outflow opening,
170: outflow pipe,
18: outlet,
20: lifting mechanism,
21: tower,
211: fixation base,
212: housing,
213: driving source,
214: reducer,
215: gear,
216: timing pulley,
217: timing belt,
218: guide,
219: guide roller,
220: belt holder,
22: arm,
221: suspension fitting,
222: bracket,
223: bearing holder,
23: slide mechanism,
24: longitudinal rail (Y direction),
25: movable base,
251: guide roller,
26: lateral rail (X direction),
27: stopper,
28: support

The invention claimed is:

1. A liquid immersion cooling system configured to immerse a plurality of electronic devices in a cooling liquid for direct cooling, the liquid immersion cooling system comprising:
a cooling tank having an open space defined by a bottom wall and side walls;
a plurality of arrayed housing parts formed by dividing the open space of the cooling tank with a plurality of inner partitions therein, each of the arrayed housing parts being configured to house at least one unit of the electronic device; and
a lifting mechanism having an arm configured to lift at least the one unit of the electronic device from the housing part, and lowering the electronic device into the housing part, wherein:
the lifting mechanism includes a tower having a guide and a driving source for raising and lowering the arm, a slide mechanism attached to the cooling tank for movably supporting the tower with respect to the cooling tank in a horizontal plane located above the open space, and a stopper for restricting a movement of the tower so that a range where the tower moves in a width direction of the cooling tank does not substantially exceed at least a width of the open space.

2. The liquid immersion cooling system according to claim 1, wherein:
the slide mechanism includes a pair of longitudinal rails attached to top ends of a pair of side walls disposed in the width direction of the cooling tank, a movable bases movably supported on the pair of longitudinal rails, and a pair of lateral rails disposed on the movable bases; and
the tower is movably supported on the pair of lateral rails.

3. The liquid immersion cooling system according to claim 1, wherein the lifting mechanism further includes a controller for controlling operations to raise and lower the arm, and to bring the arm into a stationary state at an arbitrary height in a vertical direction of the tower.

4. The liquid immersion cooling system according to claim 2, wherein the pair of longitudinal rails have running ranges where the movable bases are located rearward apart from above the open space of the cooling tank.

5. The liquid immersion cooling system according to claim 2, wherein:
the cooling tank includes a top board for closing the open space; and
the pair of longitudinal rails are located outside a width of the top board when the top board is disposed on an opening of the cooling tank.

6. The liquid immersion cooling system according to claim 1, wherein:
the cooling tank includes an inflow opening and an outflow opening for the cooling liquid, and
the inflow opening is formed in a bottom part or a side surface of each of the housing parts, and the outflow opening is formed in the vicinity of a liquid level of the cooling liquid.

7. The liquid immersion cooling system according to claim 1, wherein:
the cooling tank includes an inflow opening and an outflow opening for the cooling liquid;
at least one of the inner partitions includes a plurality of inflow pipes or a plurality of outflow pipes extending to a position in the vicinity of a liquid level of the cooling liquid while penetrating the bottom wall, and a plurality of board retainers for holding edges of boards of the respective electronic devices;
each of the inflow pipes includes a plurality of small holes in a longitudinal direction of the inflow pipe as the inflow openings;
each of the outflow pipes includes a plurality of small holes in a longitudinal direction of the outflow pipe as the outflow openings, and
at least one outflow opening is formed in the vicinity of the liquid level of the cooling liquid.

8. A liquid immersion cooling system configured to immerse a plurality of electronic devices in a cooling liquid for direct cooling, the liquid immersion cooling system comprising:
a plurality of cooling tanks adjacently arranged in a lateral direction, the cooling tank having an open space defined by a bottom wall and side walls;
a plurality of arrayed housing parts formed by dividing the open space of the cooling tank with a plurality of inner partitions therein, each of the arrayed housing parts being configured to house at least one unit of the electronic device; and
at least one lifting mechanism having an arm configured to raise at least the one unit of the electronic device from the housing part, and lower the electronic device into the housing part, wherein:
the at least one lifting mechanism includes a tower having a guide and a driving source for raising and lowering the arm, a slide mechanism attached to the adjacent cooling tanks for movably supporting the tower with respect to the adjacent cooling tanks in a horizontal plane located above the open space, and a stopper for restricting a movement of the tower so that a range where the tower moves in a width direction of the adjacent cooling tanks does not substantially exceed a distance between the farthest separated side walls in the lateral direction among those for forming the open spaces of the adjacent cooling tanks.

9. The liquid immersion cooling system according to claim 8, wherein:
the slide mechanism includes a pair of longitudinal rails attached to top ends of a pair of side walls disposed in the width direction of the cooling tank, a movable bases movably supported on the pair of longitudinal rails, and a pair of lateral rails disposed on the movable bases, and
the tower is movably supported on the pair of lateral rails.

10. The liquid immersion cooling system according to claim 8, wherein the lifting mechanism further includes a controller for controlling operations to raise and lower the arm, and to bring the arm into a stationary state at an arbitrary height in a vertical direction of the tower.

11. The liquid immersion cooling system according to claim 9, wherein the pair of longitudinal rails have running ranges where the movable bases are located rearward apart from above the open space of the cooling tank.

12. The liquid immersion cooling system according to claim 9, wherein:
the cooling tank includes a top board for closing the open space, and
the pair of longitudinal rails are located outside a width of the top board when the top board is disposed on an opening of the cooling tank.

13. The liquid immersion cooling system according to claim 8, wherein:
the cooling tank includes an inflow opening and an outflow opening for the cooling liquid; and
the inflow opening is formed in a bottom part or a side surface of each of the housing parts, and the outflow opening is formed in the vicinity of a liquid level of the cooling liquid.

14. The liquid immersion cooling system according to claim 8, wherein:
the cooling tank includes an inflow opening and an outflow opening for the cooling liquid;
at least one of the inner partitions includes a plurality of inflow pipes or a plurality of outflow pipes extending to a position in the vicinity of a liquid level of the cooling liquid while penetrating the bottom wall, and a plurality of board retainers for holding edges of boards of the respective electronic devices;
each of the inflow pipes includes a plurality of small holes in a longitudinal direction of the inflow pipe as the inflow openings;
each of the outflow pipes includes a plurality of small holes in a longitudinal direction of the outflow pipe as the outflow openings, and
at least one outflow opening is formed in the vicinity of the liquid level of the cooling liquid.

* * * * *